(12) United States Patent  
Naylor et al.

(10) Patent No.: US 11,532,558 B2  
(45) Date of Patent: Dec. 20, 2022

(54) METALLIZATION BARRIER STRUCTURES FOR BONDED INTEGRATED CIRCUIT INTERFACES

(71) Applicant: Intel Corporation, Santa Clara, CA (US)

(72) Inventors: Carl Naylor, Portland, OR (US); Mauro Kobrinsky, Portland, OR (US); Richard Vreeland, Beaverton, OR (US); Ramanan Chebiam, Hillsboro, OR (US); William Brezinski, Beaverton, OR (US); Brennen Mueller, Portland, OR (US); Jeffery Bielefeld, Forest Grove, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/585,666

(22) Filed: Sep. 27, 2019

(65) Prior Publication Data

US 2021/0098387 A1 Apr. 1, 2021

(51) Int. Cl.
*H01L 23/532* (2006.01)
*H01L 21/768* (2006.01)

(52) U.S. Cl.
CPC .. *H01L 23/53238* (2013.01); *H01L 21/76831* (2013.01); *H01L 21/76871* (2013.01); *H01L 21/76877* (2013.01)

(58) Field of Classification Search
CPC ......... H01L 23/53238; H01L 21/76831; H01L 21/76877; H01L 21/76834; H01L 21/76883; H01L 24/00
See application file for complete search history.

(56) References Cited

U.S. PATENT DOCUMENTS 6,448,591 B1 9/2002 Juengling  
6,509,274 B1 1/2003 Guo et al.  
(Continued)

FOREIGN PATENT DOCUMENTS

| EP | 3945556 | 2/2022 |
| JP | 2005012016 | 1/2005 |
| WO | 2001015220 | 3/2001 |

OTHER PUBLICATIONS

Merkx, Marc J. M., et al., "Area-Selective Atomic Layer Deposition of TiN Using Aromatic Inhibitor Molecules for Metal/Dielectric Selectivity", Chemistry of Materials, 2020, 8 pgs.

*Primary Examiner* — Selim U Ahmed  
*Assistant Examiner* — Evan G Clinton  
(74) *Attorney, Agent, or Firm* — Essential Patents Group, LLP (57) ABSTRACT

Composite integrated circuit (IC) device structures that include two components coupled through a hybrid bonded composite interconnect structure. The two components may be two different monolithic IC structures (e.g., chips) that are bonded over substantially planar dielectric and metallization interfaces. Composite interconnect metallization features formed at a bond interface may be doped with a metal or chalcogenide dopant. The dopant may migrate to a periphery of the composite interconnect structure and form a barrier material that will then limit outdiffusion of a metal, such as copper, into adjacent dielectric material.

20 Claims, 8 Drawing Sheets

(56) References Cited

U.S. PATENT DOCUMENTS

| | | | |
|---|---|---|---|
| 6,607,982 B1* | 8/2003 | Powell | H01L 21/2855 |
| | | | 257/E21.169 |
| 8,975,138 B2 | 3/2015 | Chandhok et al. | |
| 2001/0054769 A1 | 12/2001 | Raaijmakers et al. | |
| 2005/0153544 A1 | 7/2005 | Suh et al. | |
| 2005/0191846 A1 | 9/2005 | Cheung et al. | |
| 2010/0187693 A1* | 7/2010 | Mountsier | H01L 21/76864 |
| | | | 257/751 |
| 2014/0117546 A1* | 5/2014 | Liu | H01L 21/76834 |
| | | | 257/751 |
| 2015/0056800 A1 | 2/2015 | Mebarki et al. | |
| 2017/0372960 A1 | 12/2017 | Mebarki et al. | |
| 2019/0304836 A1 | 10/2019 | Kikuchi et al. | |
| 2020/0105592 A1 | 4/2020 | Kuo et al. | |
| 2020/0168500 A1 | 5/2020 | Lazzarino et al. | |
| 2021/0398996 A1 | 12/2021 | Parekh | |
| 2022/0139823 A1 | 5/2022 | Lin et al. | |

\* cited by examiner

METALLIZATION BARRIER STRUCTURES FOR BONDED INTEGRATED CIRCUIT INTERFACES

BACKGROUND

Demand for integrated circuits (ICs) in portable electronic applications has motivated greater levels of semiconductor device integration. Hybrid bonding is an approach where a first wafer or chip surface having both metal (e.g., copper) regions and dielectric regions is bonded with second wafer or chip surface having both metal and dielectric regions that are matched to those of the first wafer or chip surface so that both metal-to-metal bonds and dielectric-to-dielectric bonds are formed. Such bonding may allow for the dimensions of die electrical connections to be shrunk well below prior limits, thereby increasing the interconnect densities and/or increasing the number of addressable signals for a composite IC chip of a given size (footprint).

With hybrid bonding, lateral (e.g., within an x-y plane of the bonding interface) misalignment or misregistration between conductive features of a few hundred nanometers may occur. Although such lateral misalignment will likely continue to decrease in magnitude as the art of hybrid bonding advances, it may remain significantly larger than misregistration between successive lithographically defined BEOL metallization layers. For example, with misalignment between two bonded conductive features being an order of magnitude, or more, than the lateral misalignment between conductive features (e.g., lines or traces) and an underlying conductive feature (e.g., a via). Such misalignment is particularly problematic where the bonded conductive features comprise a metal (e.g., Cu) that might be able to diffuse out of the interconnect structure and into adjacent dielectric material as a result of such misalignment.

Interconnect metal diffusion is often mitigated in conventional BEOL metallization layers through the use of one or more metal diffusion barriers (e.g., Ta, TaN, TiN, etc.), but such barriers are not typically on a hybrid bonding interface, and so metallization feature misalignment will result in a bondline that includes a metallization-dielectric interface through which metal (e.g., Cu) may outdiffuse into the dielectric. Techniques and structures that reduce the outdiffusion of metal through such hybrid bonded surfaces may therefore be commercially advantageous.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION

One or more embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment" or "one embodiment" means that a particular feature, structure, function, or characteristic described in connection with the embodiment is included in at least one embodiment of the invention. Thus, the appearances of the phrase "in an embodiment" or "in one embodiment" in various places throughout this specification are not necessarily referring to the same embodiment of the invention.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description of the invention and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship).

The terms "over," "under," "between," and "on" as used herein refer to a relative position of one component or material with respect to other components or materials where such physical relationships are noteworthy. For example in the context of materials, one material or material disposed over or under another may be directly in contact or may have one or more intervening materials. Moreover, one material disposed between two materials or materials may be directly in contact with the two layers or may have one or more intervening layers. In contrast, a first material or material "on" a second material or material is in direct contact with that second material/material. Similar distinctions are to be made in the context of component assemblies.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

Described herein are composite integrated circuit (IC) device structures that include two components coupled through a hybrid bonded interface. In exemplary embodiments, the two components are two different monolithic IC structures (e.g., chips) that are bonded over a substantially planar dielectric and metallization interface. In accordance with some embodiments, a composite interconnect metallization structure includes a diffusion barrier suitable for retarding outdiffusion of metal from the composite interconnect structure (e.g., across a bond interface, and into an adjacent dielectric material). The diffusion barrier may be advantageously formed subsequent to a hybrid bonding process. The diffusion barrier may be formed at least where there is a metal-dielectric bond interface, for example resulting from lateral misalignment between a first metallization feature and a corresponding second metallization feature that is to be bonded to form the composite interconnect structure. For some embodiments where a diffusion barrier along a sidewall of the first and second metallization features is formed prior to bonding, a diffusion barrier formed subsequent to bonding may supplement, or augment, the sidewall diffusion barrier to ensure metal of a composite interconnect structure is fully contained.

In some embodiments, the formation of a diffusion barrier at a periphery of a composite interconnect structure entails doping one or more of the metallization features that are to be bonded with a metal or chalcogen that has sufficient mobility to migrate to the periphery of the composite interconnect structure. At the periphery, the dopant is to react with one or more constituents of the composite interconnect structure (e.g., a metal in the metallization feature) or the adjacent dielectric material (e.g., oxygen or silicon in the dielectric) to form the diffusion barrier. For embodiments where a dopant reacts with another constituent of the metallization feature, barrier material may form along a sidewall of the composite interconnect structure. The barrier material may also form at an interface with any dielectric material that is adjacent to a portion of the composite interconnect structure, for example as a result of feature misalignment during the bonding process. For embodiments where a dopant reacts with a constituent of the adjacent dielectric material, barrier material may be limited to only interfaces of the metallization feature(s) and dielectric material(s). In such embodiments, the barrier material is essentially self-aligned or "self-formed" to a portion of the composite interconnect structure otherwise lacking a barrier layer, for example as a result of lateral feature misalignment during the bonding process.

Figure 1:
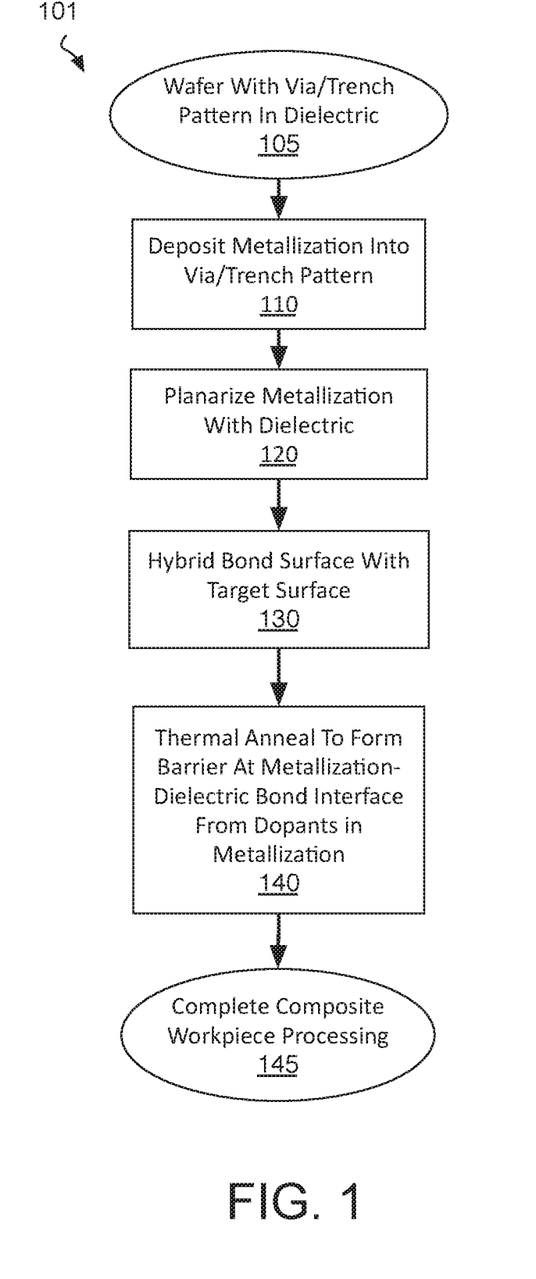
FIG. 1 is a flow diagram illustrating methods of hybrid bonding surfaces and forming bonded composite interconnect structures that include a diffusion barrier, in accordance with some embodiments.

FIG. 1 is a flow diagram illustrating composite IC fabrication methods 101, in accordance with some embodiments. Methods 101 begin with preparing a workpiece having a hybrid surface suitable for bonding. Such a hybrid surface may be prepared according to any damascene process suitable for BEOL interconnect metallization, for example. At block 105, a starting material, such as a semiconductor wafer, is received. The starting material may advantageously include a monocrystalline semiconductor layer, such as a silicon layer, upon which field effect transistors (FETs) may have been fabricated, for example upstream of methods 101. The starting material received may include FETs of any architecture. The FETs may be interconnected into circuitry by one or more interconnect metallization levels. In some examples, the FETs include both n-type and p-type FETs interconnected into a CMOS circuit. In other embodiments, the substrate received at block 105 includes no prefabricated transistors or any other active microelectronic devices. For example, the substrate may be a passive interposer that includes only interconnect metallization layers.

Figure 2:
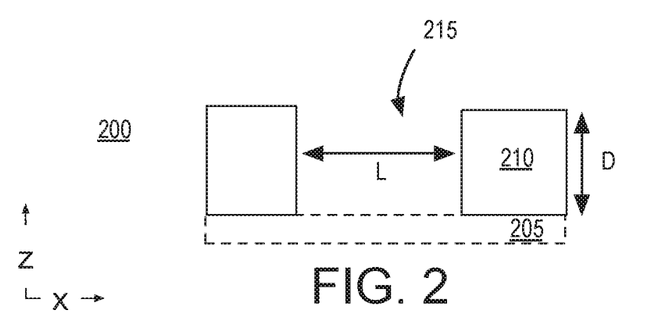
FIG. 2 is cross-sectional view of a starting material structure, in accordance with some embodiments.

A working surface of the starting material received at block 105 includes a via and/or trench pattern in a dielectric material. The via and/or trench pattern may have been lithographically defined and anisotropically etched into the dielectric material, for example. FIG. 2 is cross-sectional view of workpiece 200 that includes an opening 215 within a dielectric material 210, in accordance with some embodiments. Dielectric material 210 may be any low-k material (e.g., having a relative permittivity below about 3.5), or moderate-k material (e.g., having a relative permittivity above about 3.5), for example. Exemplary dielectric materials include silicon dioxide, silicon nitride, silicon oxynitride and carbon doped oxide (SiOC). Dielectric material 210 is over an area of a substrate 205, which is illustrated in dashed line to emphasize that substrate 205 may include any number of BEOL metallization layers and/or FEOL semiconductor material layers not specifically illustrated for the sake of clarity.

As shown in FIG. 2, an opening 215 extends into dielectric material 210. Opening 215 may have any lateral dimensions (e.g., within x-y plane) and may have any depth (e.g., along z-axis). In one example, opening 215 is a trench having a minimum transverse width equal to lateral length L, and a longer longitudinal length in a direction orthogonal to the transverse width (e.g., y-axis). In another example, opening 215 is a via having a diameter approximately equal to lateral length L, extending into substrate 205, and landing on an underlying metallization layer (not depicted). The lateral length L may vary widely, for example from tens of nm to tens of microns. In some exemplary embodiments, lateral length L is at least 1 μm, and may be 10 μm, or more. Although illustrated to extend through dielectric 210, opening 215 may have a widely varying depth D (e.g., z-axis) that may be less than or greater than the film thickness of dielectric 210. Opening depth D may vary from tens to hundreds of nanometers, for example. In some exemplary embodiments where the lateral length L is at least 1 μm, depth D is less than 1 μm. Notably, the aspect ratio illustrated for opening 215 is not to scale with the z-axis being magnified and the x-axis being compressed.

Returning to FIG. 1, methods 101 continue at block 110 where metallization is deposited to fill the via and/or trench pattern. Any metal deposition process may be employed at block 110 to deposit one or more metallic compounds and/or metals. In some embodiments, block 110 entails the deposition of one or more barrier materials, which may be any metal or metallic compound known to be suitable for containing BEOL metallization. Such barrier material(s) may be deposited by any suitable deposition technique, such as, but not limited to, physical vapor deposition (PVD), chemical vapor deposition (CVD), atomic layer deposition (ALD), or electroless deposition (ED). Barrier materials need not be formed by block 110 for embodiments where a complete barrier will be formed subsequent to forming a composite interconnect structure.

Block 110 may further entail the deposition of one or more fill metals. The fill metal comprises one or more metals that are advantageously contained by the barrier material. The fill metal may be deposited by any technique(s) known to be suitable for the particular metal(s). In some exemplary embodiments, fill metal deposition at block 110 comprises first the deposition of a seed layer by some non-electrolytic means (e.g., PVD, autocatalytic deposition, etc.) followed by an electrolytic plating process.

In some embodiments, one or more barrier material constituents are introduced into the fill metal as dopants just prior to, during, or subsequent to, deposition of a seed layer. In some exemplary embodiments, these "barrier" dopant(s) have sufficient mobility within the fill metal that they are able to subsequently diffuse a distance that allows them to reach the periphery of the fill metal proximal to a bond interface where the metallization will make contact with mating material(s). The barrier dopant(s) are also reactive with another constituent proximal the bond interface to form a barrier material that is a suitable for retarding subsequent diffusion of the fill metal constituent(s) across the barrier material.

In some embodiments, the barrier dopant introduced is a metal capable of forming a metallic compound with adequate barrier properties. Metallic dopants may be one or more of Al, Mn, Mg or Zn, for example. These exemplary metallic dopants have been found by the inventors to be mobile within a fill metal that comprises predominantly another metal, such as Cu. These exemplary metallic dopants have also been found by the inventors to react with one or more constituent of certain dielectric materials, such as, but not limited to, O and Si, to form a metallic compound, such as a metal oxide or metal silicate. Such metallic compounds, when of sufficient thickness (e.g., 1-4 nm), have been found to retard diffusion of the fill metal (e.g., Cu). Metallic dopants may be introduced during the deposition of a fill metal seed layer, for example with a co-sputter process, or by sputtering an alloy target, for example. In one illustrative example, a target of Cu-Al alloy (e.g., Cu with 0.5-1.5% Al) is sputtered to form an Al-doped Cu seed layer. Such a seed layer may be deposited to any thickness to achieve any threshold mass of Al dopant desired. In other examples, a sputter target of Cu—Mn, Cu—Mg, or Cu—Zn alloy may be employed to form a seed layer doped with a barrier material constituent. In alternative embodiments, a thin layer of barrier metal (e.g., Al, Mn, Mg or Zn) may be deposited before a substantially pure Cu seed layer is deposited.

Following deposition of the doped seed layer, the fill metal may be electrolytically plated upon the seed layer according to any suitable technique(s). In some embodiments where the metallic dopants to be enlisted for subsequent barrier formation are introduced within the seed layer, the fill metal may be plated as substantially pure metal (e.g., pure Cu). In other embodiments, metallic dopants that are to be enlisted for subsequent barrier formation are introduced by the plating process, either in addition to those introduced within the seed layer, or instead of introducing dopants within the seed layer.

Figure 3A:
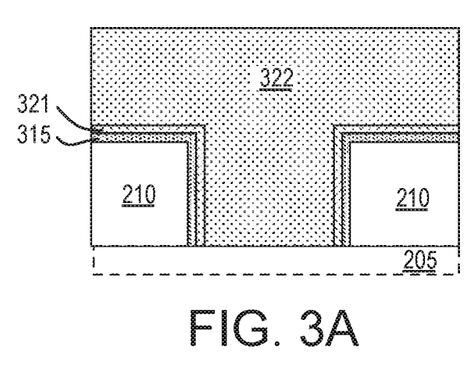
FIGS. 3A-3B are cross-sectional views of fabrication and planarization of a metallization feature within a dielectric material, in accordance with some embodiments.

In one example illustrated by FIG. 3A, a sidewall barrier material 315 is in contact with a sidewall and top surface of dielectric material 210. A fill metal 322 is over sidewall barrier material 315. Sidewall barrier material 315 is illustrated as being substantially conformal, but it need not be. In some embodiments, sidewall barrier material 315 comprises a metal, such as, but not limited, Ti, W, or Ta with Ta being particularly well suited for retarding outdiffusion of Cu. In some further embodiments, sidewall barrier material 315 further comprises nitrogen with one exemplary metallic compound being $TaN_x$. In some further embodiments, sidewall barrier material 315 comprises one or more other constituent, such as, but not limited to Si (e.g., Ta-Si-N). Sidewall barrier material 315 may also comprise multiple material layers, for example with a first material layer improving adhesion of the next layer (e.g., Ta/TaN). Sidewall barrier material 315 may have any layer thickness known to be suitable for BEOL metallization, with some Ta examples being in the 2-20 nm range.

As further shown in FIG. 3A, a seed layer 321 is between fill metal 322 and sidewall barrier material 315. The presence of seed layer 321 is indicative of fill metal 322 having been electrolytically plated. Seed layer 321 is also illustrated as substantially conformal, but need not be. In some examples, seed layer 321 comprises predominantly the major constituent of fill metal 322, and may further include one or more of the metallic dopants introduced above (e.g., 0.5-1.5% Al) to subsequently serve as a source of barrier metal constituents. Seed layer 321 may have any thickness known to be suitable for BEOL metallization, with some exemplary Cu-Al alloy embodiments being in the 2-20 nm range.

Fill metal 322 may have substantially the same composition as seed layer 321, or may lack one or more of the metallic dopants present in seed layer 321, or may include the metallic dopants present in seed layer 321 at some lower concentration than that of seed layer 321. Fill metal 322 may, for example, comprise predominantly Cu, and (e.g., if electrolytically plated) may be substantially pure Cu. In other examples, fill metal comprises predominantly a metal other than Cu, such as Co, or Ru.

Figure 3B:
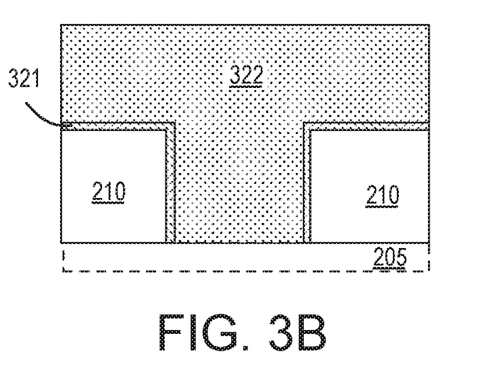

In the example shown in FIG. 3B, no sidewall barrier material is deposited. Instead, seed layer 321 is deposited directly on dielectric material 210. Hence, a sidewall barrier material may be formed during metallization, or not.

In some embodiments, the barrier dopant introduced into a metallization feature is a chalcogen rather than a metal. As used herein chalcogens include sulfur, selenium or tellurium (oxygen is excluded). The inventors currently understand each of these chalcogen dopants to be mobile within a fill metal that comprises predominantly Cu and/or other metal (e.g., Co). Based on experiments performed on Cu-S material systems, the inventors further understand these chalcogen dopants to be capable of reacting with one or more constituent of the fill metal, such as, but not limited to Cu, to form a metal (di)chalcogenide (e.g., $CuS_x$, $CuSe_x$, $CuTe_x$, $CuSe_xS_y$, $CuSe_xTe_y$, etc.). These mobile chalogen dopants may be introduced before, during or after the deposition of a fill metal seed layer, for example with a post-deposition treatment of the seed metal and/or fill metal, for example.

In FIGS. 3A and 3B, for example, seed layer 321 may be exposed to a chalcogen precursor that introduces the chalcogen onto at least the surface of seed layer 321. In some examples, seed layer 321 is heated to over 100° C. (e.g., 125° C., 150° C., 200° C., or 250° C.) for a predetermined time in the presence a precursor gas. The precursor gas may have various compositions, with some examples including $H_2S$, $H_2Se$, $H_2Te$. As these examples can also act as strong reducing agents, they may be combined or replaced with weaker reducing agents/stronger oxidizing agents. For example, in some embodiments $SO_2$ or $SeO_2$ is introduced in combination with, or to the exclusion of, $H_2S$ or $H_2Se$, respectively, with gases lacking oxygen tempering the reducing strength somewhat less than those that introduce oxygen. Other gases, such as, $NH_3$, $N_2$, Ar, $N_2O$, or $S_xO_y$, $Se_xO_y$, $Te_xO_y$ with x or y being 1, 2 (e.g., $SO_2$, $SeO_2$) or 3, or $SF_z$, $Se_z$ or $Te_z$ with z either 4 or 6 (e.g., $SF_6$, $TeF_6$) may also be introduced in combination with one or more of $H_2S$ and, $H_2Se$ and or $H_2Te$.

Returning to FIG. 1, methods 101 continue at block 120 where the metallization is planarized with a surface of the dielectric to define a planar hybrid surface comprising metallization features embedded within dielectric material. At block 120 any CMP process known to be suitable for BEOL metallization may be practiced, for example, to remove metallization overburden and remove any barrier and/or adhesion layer materials to expose the underlying dielectric material. This last operation in the damascene metallization process ideally leaves the hybrid metal/dielectric surface sufficiently flat for subsequent bonding. If not, one or more additional processes may be performed to prepare the surface for bonding.

Figure 4A:
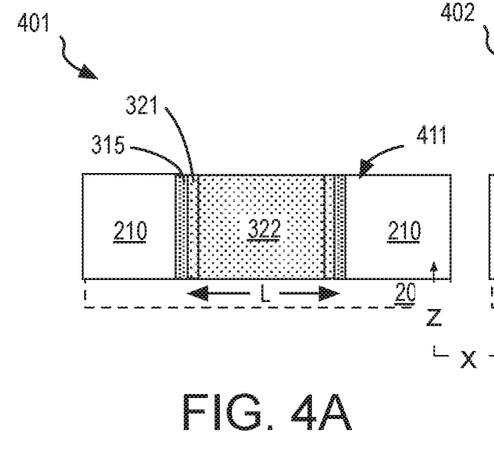
FIGS. 4A-4B are cross-sectional views of fabrication and planarization of a metallization feature within a dielectric material, in accordance with some alternative embodiments.

FIG. 4A illustrates an exemplary hybrid bonding feature 401 following planarization of the structure illustrated in FIG. 3A. Hybrid bonding feature 401 includes a bonding surface 411 comprising both dielectric material 210 and a metallization feature comprising fill metal 322. In this example, sidewall barrier 315 and seed layer 321 are present at the periphery of fill metal 322. In accordance with some embodiments, at least seed layer 321 includes a barrier dopant. In accordance with other embodiments, such barrier dopants from which a barrier will be formed have yet to be introduced into the metallization.

Figure 4B:
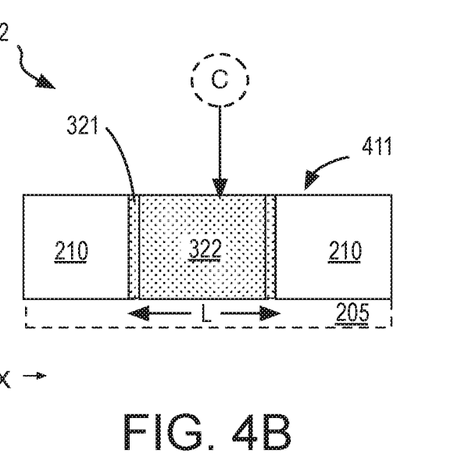

FIG. 4B illustrates an exemplary hybrid bonding feature 402 following planarization of the structure illustrated in FIG. 3B. As shown, a chalcogen C may be incorporated into at least a planarized top surface of fill metal 322, for example using a technique similar to that described above in the context of doping seed layer 321. In some embodiments, a surface of fill metal 322 is heated to over 100° C. (e.g., 125° C., 150° C., 200° C., or 250° C.) for a predetermined time in the presence a precursor gas, such as any of those provided above. Although not illustrated, the chalcogen dopant C may be concurrently introduced into other materials, such as seed layer 321 and dielectric material 210, etc.

Returning to FIG. 1, methods 101 continue at block 130 where the hybrid bonding structure prepared according to blocks 110-120 is bonded to some target surface, such as a surface of a single die (chip), or a surface of a wafer. In some embodiments, the target surface also includes a hybrid bonding structure that has also been prepared according to methods 101. In other embodiments, the target surface includes a hybrid bonding structure that is only processed through damascene operations such that the target surface has a bondable surface, but lacks the barrier dopants introduced by methods 101.

In hybrid bonding, chemical bonds are formed both between metallization features (e.g., via metal interdiffusion) and between dielectric materials (e.g., via Si—O—Si condensation bonds) of the host and target. Thermo-compression bonding may be at low temperature (e.g., below melting temperature of the interconnects, and more specifically below 100° C.). Direct bonding at room temperature (i.e., compression only) is also possible. After bonding, selective heating may be performed to make the bond permanent. For selective heating, a heat mask may or laser heating may be employed to limit the heat to the specific chiplet locations. Bonding at block 130 may be performed with any permanent bonding system capable of high resolution alignment, such as one commercially available through EV Group, SUSS MicroTec, or Tokyo Electron Limited (TEL), for example.

Figure 5:
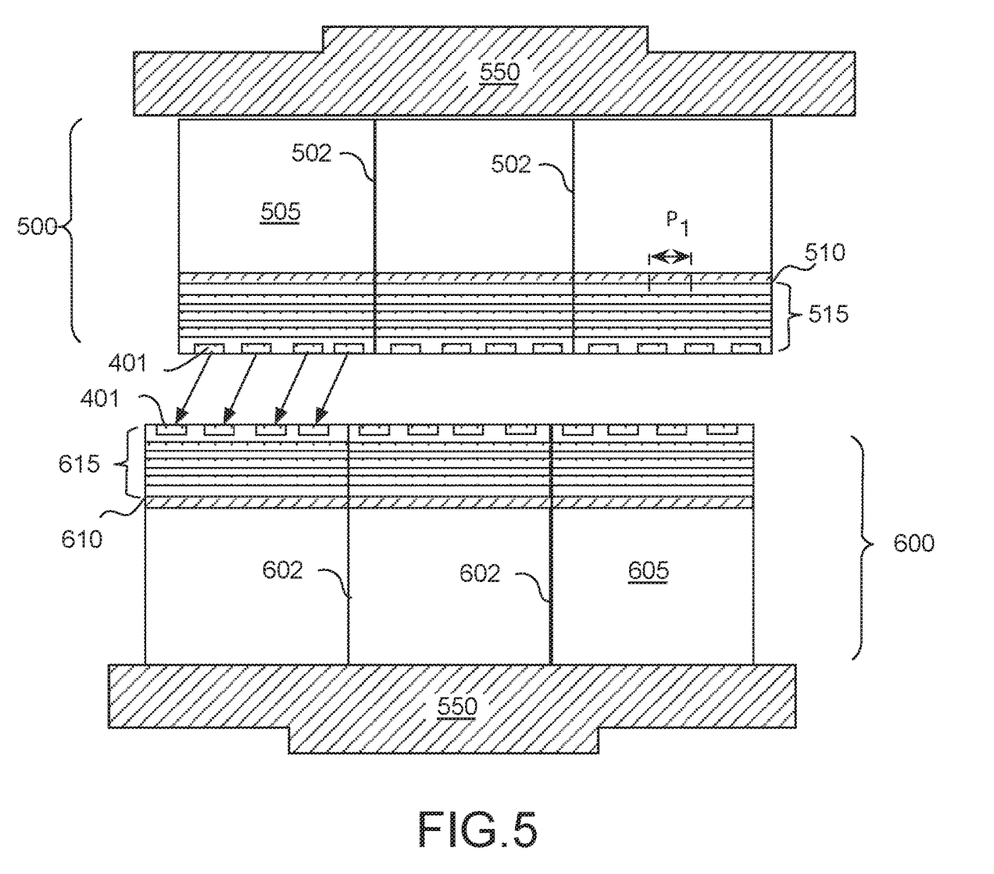
FIG. 5 is a cross-sectional view of wafer-to-wafer hybrid bonding, in accordance with some embodiments.

In the example further illustrated in FIG. 5, a bonding workpiece 500 is temporarily affixed to a first chuck or microtool 550. Bonding workpiece 500 is a semiconductor wafer that includes a host device layer 510 between a substrate 505 and BEOL metallization levels 515. Substrate 505 may be homogenous with device layer 510, or not (e.g., a transferred substrate). In exemplary embodiments, bonding substrate 500 is contiguous across multiple IC chips with streets 502 demarking where bonding workpiece 500 will be subsequently scribed during a singulation process. Alternatively, bonding workpiece 500 may be a reconstituted assembly of IC chips that have been previously singulated. In some exemplary embodiments, top level of metallization levels 515 includes hybrid bonding feature 401, substantially as described above.

Another bonding workpiece 600 is similarly temporarily affixed to a second chuck or microtool 650. In the illustrated example, bonding workpiece 600 is a semiconductor wafer that includes a host device layer 610 between a substrate 605 and BEOL metallization levels 615. Substrate 605 may be homogenous with device layer 610, or not (e.g., a transferred substrate). In exemplary embodiments, bonding workpiece 600 is contiguous across multiple IC chips with streets 602 demarking where bonding workpiece 600 will be subsequently scribed during a singulation process. Alternatively, bonding workpiece 600 may be a reconstituted assembly of IC chips that have been previously singulated.

In the illustrated embodiment, a top level of metallization levels 615 includes hybrid bonding feature 401 (FIG. 4A), having one or more of the attributes substantially as described above. In alternative embodiments, only one of top level of metallization levels 515 and 615 includes a hybrid bonding feature 401, while the other includes a metallization feature lacking the dopant(s) described above in the context of forming hybrid bonding feature 401. In alternative embodiments, at least one of top level of metallization levels 515 and 615 includes hybrid bonding feature 402 (FIG. 4B), having one or more of the attributes substantially as described above. In a bonding process, hybrid bonding feature 401 or 402 is brought into alignment with, and into contact with, a corresponding hybrid bonding feature (e.g., 401 or 402) to form a composite interconnect structure. In this "face-to-face" configuration, a direct bond is formed between the hybrid bonding features of bonding workpiece 500 and the hybrid bonding features of bonding workpiece 600. An electrically conductive metal-metal bond at the interface of the hybrid bonding features may therefore provide a composite interconnect structure that functions as a good electrical interconnect between ICs.

Following bonding, methods 101 (FIG. 1) continue at block 140 where the composite interconnect structure is subjected to a thermal anneal (e.g., in a forming gas or other ambient) at a predetermined temperature and duration sufficient to diffuse and/or react the barrier dopants introduced into the metallization features. The anneal performed at block 140 may, in some implementations of methods 101, be combined with the bonding process performed at block 130. For example, a thermal cycle performed during the bonding process may maintain the composite interconnect structure at an elevated temperature for a duration sufficient also form a supplemental barrier at one or more interfaces of the composite interconnect structure.

In metallic dopant embodiments, metallic dopant(s) may diffuse during the anneal to interfaces of the metallization where it may react with a constituent in any suitable dielectric material to form a metallic compound (e.g., $AlO_x$, $AlSi_xO_y$), as further described below. In chalcogen dopant embodiments, chalcogen dopant(s) previously introduced may diffuse during the anneal to metallization interfaces where it may react with a constituent in the metallization to form a metal (di)chalcongenide (e.g., $CuS_x$), as further described below. In some embodiments, the anneal is performed at a temperature compatible with backend processing (e.g., <450° C.). In some chalcogen dopant embodiments, the anneal performed at block 140 is at a higher temperature than the temperature at which the chalcogen dopant is introduced into the metallization. For example, where a chalcogen dopant is introduced into a fill metal of predominantly Cu at a temperature of less than 250° C., an anneal performed at block 140 may be over 250° C. (e.g., 350° C.). Following anneal, methods 101 may be completed at block 145 where any conventional packaging/assembly techniques may be applied to the composite IC workpiece.

Figure 6A:
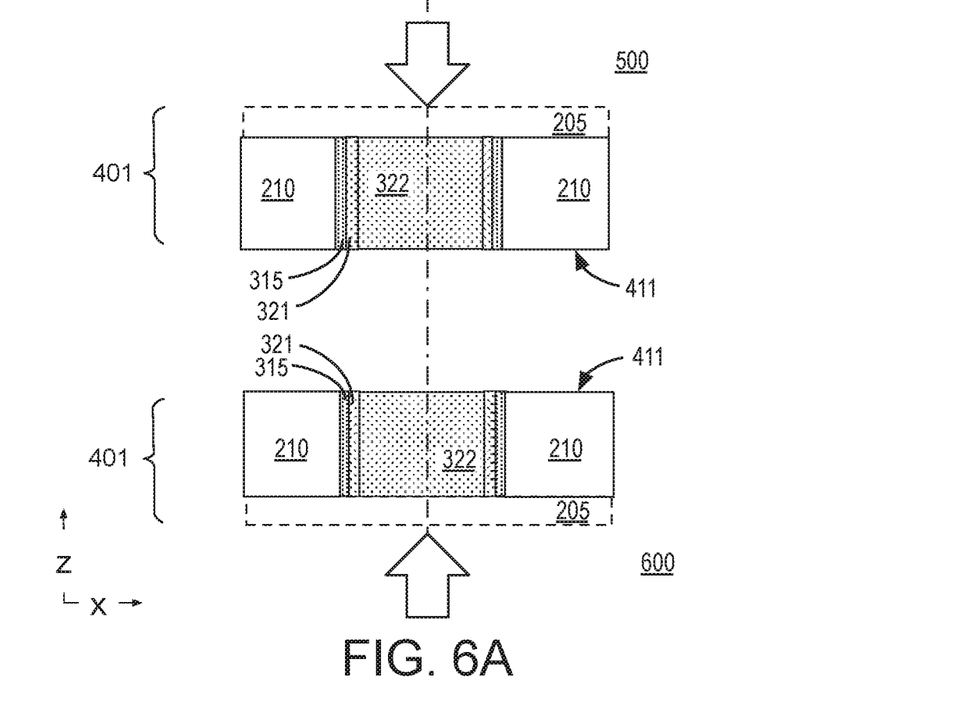
FIG. 6A is cross-sectional view of two hybrid bonding features as they are aligned for bonding, in accordance with some embodiments.
Figure 6B:
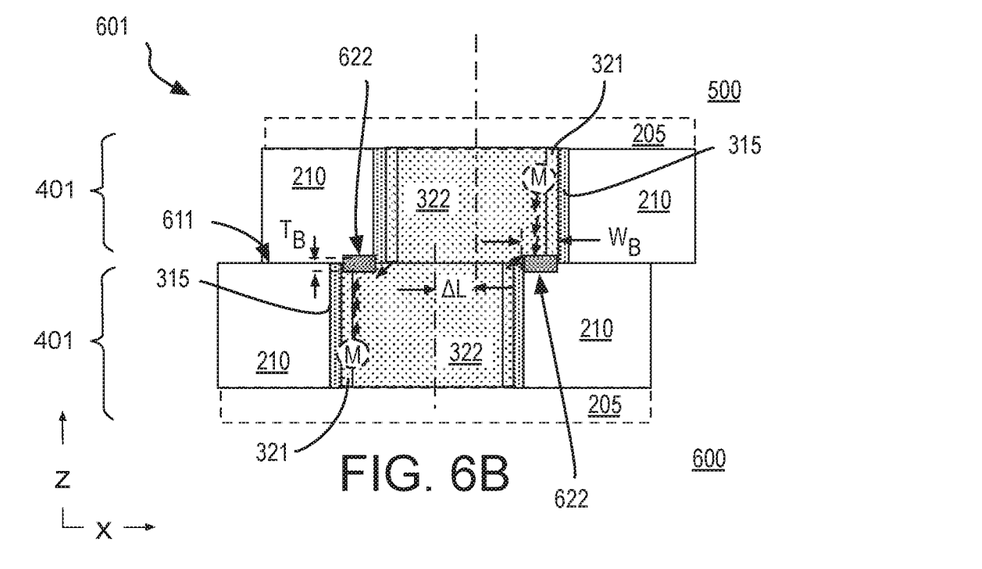
FIG. 6B is a cross-sectional view of a composite interconnect structure including a supplemental diffusion barrier following hybrid bonding of the structures shown in FIG. 6A, in accordance with some embodiments.
Figure 7A:
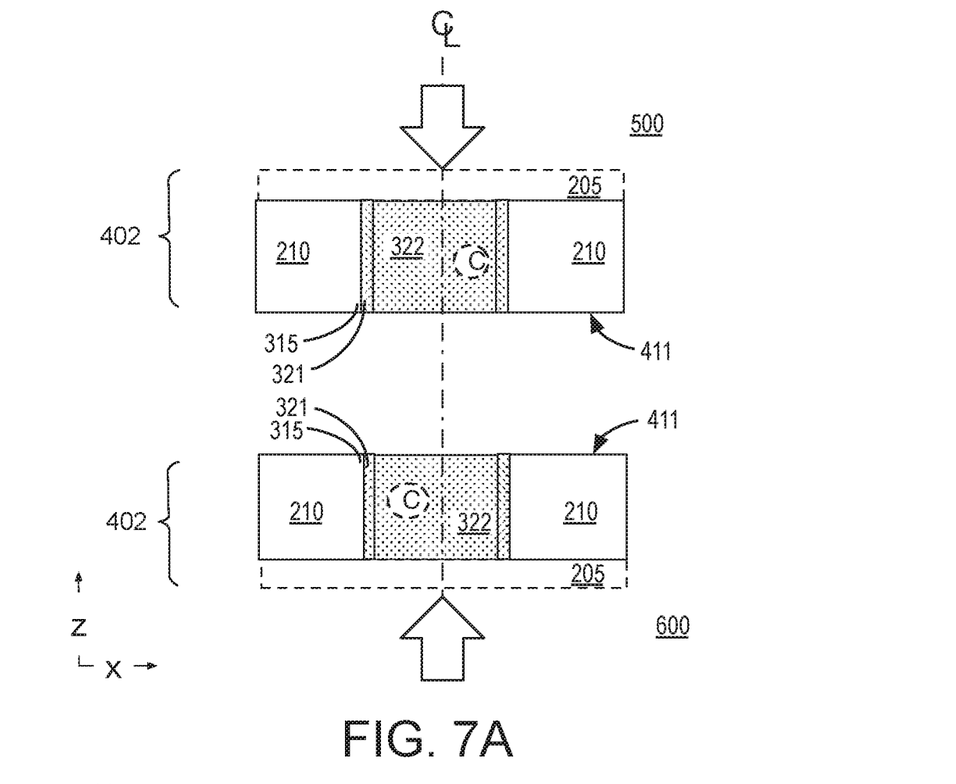
FIG. 7A is cross-sectional view of two hybrid bonding features as they are aligned for bonding, in accordance with some alternative embodiments.
Figure 7B:
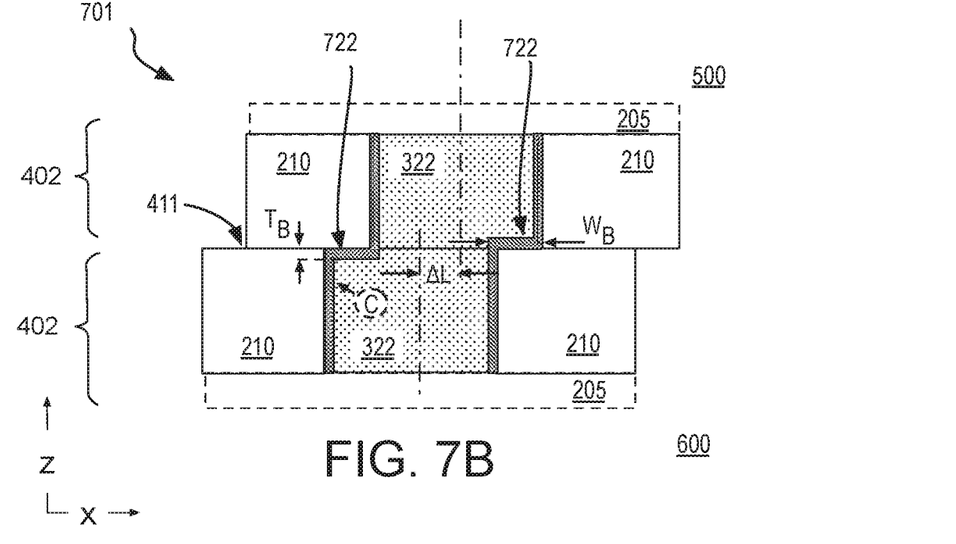
FIG. 7B is a cross-sectional view of a composite interconnect structure including a diffusion barrier following hybrid bonding of the structures shown in FIG. 7A, in accordance with some embodiments.

The architecture of composite interconnect structures of a hybrid bonded workpiece may vary depending on whether a chalcogen dopant or a metallic dopant is incorporated into a metallization feature (e.g., according to methods 101). The architecture of composite interconnect structures may also vary depending on whether or not a sidewall barrier material was deposited as part of the metallization process. FIGS. 6A-6B further illustrate some exemplary hybrid bonded structures and resulting composite interconnect structures, in accordance with some embodiments where bonded metallization features have been doped with a barrier metal. FIGS. 7A-7B further illustrate some exemplary hybrid bonded structures and resulting composite interconnect structures, in accordance with some embodiments where bonded metallization features have been doped with a barrier chalcogen. In FIGS. 6A, 6B, 7A, and 7B, reference numbers are retained for features or structures that are described above.

FIG. 6A is cross-sectional view of two substantially identical hybrid bonding features 401 as they are aligned for bonding, in accordance with some embodiments employing a metallic dopant. FIG. 6A is therefore a magnified view of the bonding process illustrated in FIG. 5. As shown in FIG. 6A, alignment along a common centerline of hybrid bonding features 401 is attempted during the bonding process. Once aligned with a given precision, hybrid bonding features 401 are displaced toward one another along their centerlines, and a compression force applied parallel to their centerlines to join the bonding interfaces 411.

FIG. 6B is a cross-sectional view of a composite interconnect structure 601 following hybrid bonding of features 401, in accordance with some embodiments. Although not drawn to scale, some lateral offset ΔL associated with misalignment of features 401 is depicted in composite structure 601. Lateral offset ΔL may vary, in some exemplary embodiments ΔL is more than 20 nm, and may be 100-200 nm, or more. As shown in FIG. 6B, barrier material 622 is formed between dielectric material 210 and fill metal 322 within portions of a first metallization feature that is misaligned or non-overlapping with a corresponding portion of another metallization feature. Barrier material 622 is highly localized to only the non-overlapping portions of fill metal 322 with no barrier material 622 forming between fill metal 322 and sidewall barrier material 315. Barrier material 622 has a lateral width $W_B$ that is approximately equal to the distance between sidewall barriers 315. Because lateral width $W_B$ is a function of ΔL (e.g., ΔL less the thickness of barrier material 321), barrier material 622 may be referred to as "self-aligned" to dielectric 210 because the barrier dopant reacts with one or more constituents of only dielectric 210.

In the example illustrated in FIG. 6B, a metallic dopant M (e.g., Al, Mg, Mn, Zn) present at least in seed layer 321 diffuses through fill metal 322 and may reach a low energy state at an interface between fill metal 322, and dielectric material 210. At this interface, metallic dopant M may react with a constituent of dielectric material 210 (e.g., O, Si) to form a metallic compound (e.g., $AlO_x$, $AlO_xSi_y$, $MgO_x$, $MgO_xSi_y$, $MnO_x$, $MnO_xSi_y$, $ZnO_x$, $ZnO_xSi_y$) as barrier material 622. For such embodiments, barrier material 622 may be substantially amorphous. Barrier material 622 has a thickness $T_B$ that may vary with the reactivity and/or quantity of metallic dopant available. In some examples, barrier material 622 has a thickness $T_B$ of less than 10 nm (e.g., 3-8 nm). Metallic dopant M (e.g., Al, Mg, Mn, Zn) may also diffuse to an interface between fill metal 322 and sidewall barrier material 315. However, the metallic dopant may not find any reactive constituents in sidewall barrier material 315, and so barrier material 622 may not form adjacent to sidewall barrier material 315.

Notably, large lateral dimensions of composite interconnect structure 601 may ensure there is a significant quantity of metal dopant M available. The presence of non-reactive sidewall barrier material 315 may further ensure a sufficient amount of metal dopant M is able to reach the interface of dielectric material 210 (i.e., is not depleted through reactions elsewhere). However, the same technique employed to form barrier material 622 may be extended to embodiments where sidewall barrier material 315 is not deposited during metallization. Under those circumstances, barrier material 622 may replace barrier material 315 in FIG. 6B.

One or more analysis techniques (e.g., XPS, XRD, or TEM) may be employed to identify barrier material 622 embedded between dielectric material 210 and fill metal 322. Notably, barrier material 622 may be absent from any non-bonded (damascene) metallization layers. For example, barrier material 622 may be absent from BEOL metallization layers 515, 615 (FIG. 5) with barrier material 622 only being present at the hybrid bond interface (e.g., within misaligned regions).

FIG. 7A is cross-sectional view of two hybrid bonding features 401 as they are aligned for bonding, in accordance with some other embodiments employing a chalogen dopant (e.g., S). FIG. 7A is therefore another magnified view of the bonding process illustrated in FIG. 5. As shown in FIG. 7A, alignment along a common centerline of hybrid bonding features 401 is attempted during the bonding process. Once aligned with a given precision, hybrid bonding features 401 are displaced relative to one another along their centerlines, and a compression force applied in parallel with their centerlines.

FIG. 7B is a cross-sectional view of a composite interconnect structure 701 following hybrid bonding of features 402, in accordance with some alternative embodiments. Composite interconnect structure 701 includes a barrier material 722 that comprises a metal chalcogenide. As shown, barrier material 722 is between dielectric material 210 and fill metal 322 within portions of a first metallization feature that is misaligned or non-overlapping with a corresponding portions of the opposing metallization feature to which it was bonded. Since no sidewall barrier material was formed previously, a portion of barrier material 722 that is between a sidewall of fill metal 322 and dielectric material 210 is also relied upon for fully containing fill metal 322. For other embodiments where a sidewall barrier (e.g., Ta) is formed during a metallization process, barrier material 722 might be between a sidewall of fill metal 322 and the sidewall barrier material, for example in a double barrier structure.

As shown in FIG. 7B, barrier material 722 extends along the entire periphery of composite interconnect structure 701 with a largest lateral width $W_B$ that is approximately equal to lateral offset $\Delta L$. Although not drawn to scale, some lateral offset $\Delta L$ associated with misalignment of features 402 is depicted in composite structure 701. Lateral offset $\Delta L$ may vary, but in some exemplary embodiments $\Delta L$ is again more than 20 nm, and may be 100-200 nm, or more.

In the example illustrated in FIG. 7B, chalogen dopant C (e.g., S, Se, Te) diffuses through fill metal 322 and may come to rest in a low energy state at interfaces of fill metal 322. At sufficient concentration, chalcogen dopant C can react (e.g., during thermal anneal) with a constituent of fill metal 322 and/or seed layer 321 (e.g., Cu) to form a metal chalcogenide (e.g., $CuS_x$, $CuSe_x$, $CuTe_x$) barrier material 722. Although barrier material 722 may be classified as a dichalcogenide ($MC_2$) in some instances, the barrier material 722 need not be a dichalcogenide because a number of oxidation states are possible such that the resulting compound is better characterized as $MC_x$, with x being between 0.2 and 4. Consistent with metal chalcogenides, barrier material 722 may have crystalline microstructure (i.e., long range atomic ordering) within a 2D plane of its monolayer(s). Diffusion barrier qualities of the metal chalcogenide may be attributable, at least in part, to the crystalline microstructure. Fill metal constituents (e.g., Cu) may be unable to traverse the crystalline barrier material even when barrier material 722 has a very small barrier material thickness $T_B$. Although s barrier material 722 is not limited to a single monolayer, in accordance with some exemplary embodiments, barrier material 722 has a thickness less than 10 nm, and advantageously less than 6 nm (e.g., 2-5 nm). Barrier material 722 may therefore have a thickness of significantly less than 10 monolayers (e.g., two, three, or four monolayers).

One or more analysis techniques (e.g., XPS, XRD, or TEM) may be employed to identify barrier material 722. For example, the composition and/or microstructure of barrier material 722 may be readily apparent with such analysis techniques. Notably, barrier material 722 may be absent from any non-bonded (damascene) metallization layers. For example, barrier material 722 may be absent from BEOL metallization layers 515, 615 (FIG. 5) with barrier material 722 only being present at the hybrid bond interface (e.g., at the periphery of the resulting composite interconnect structure).

Figure 8:
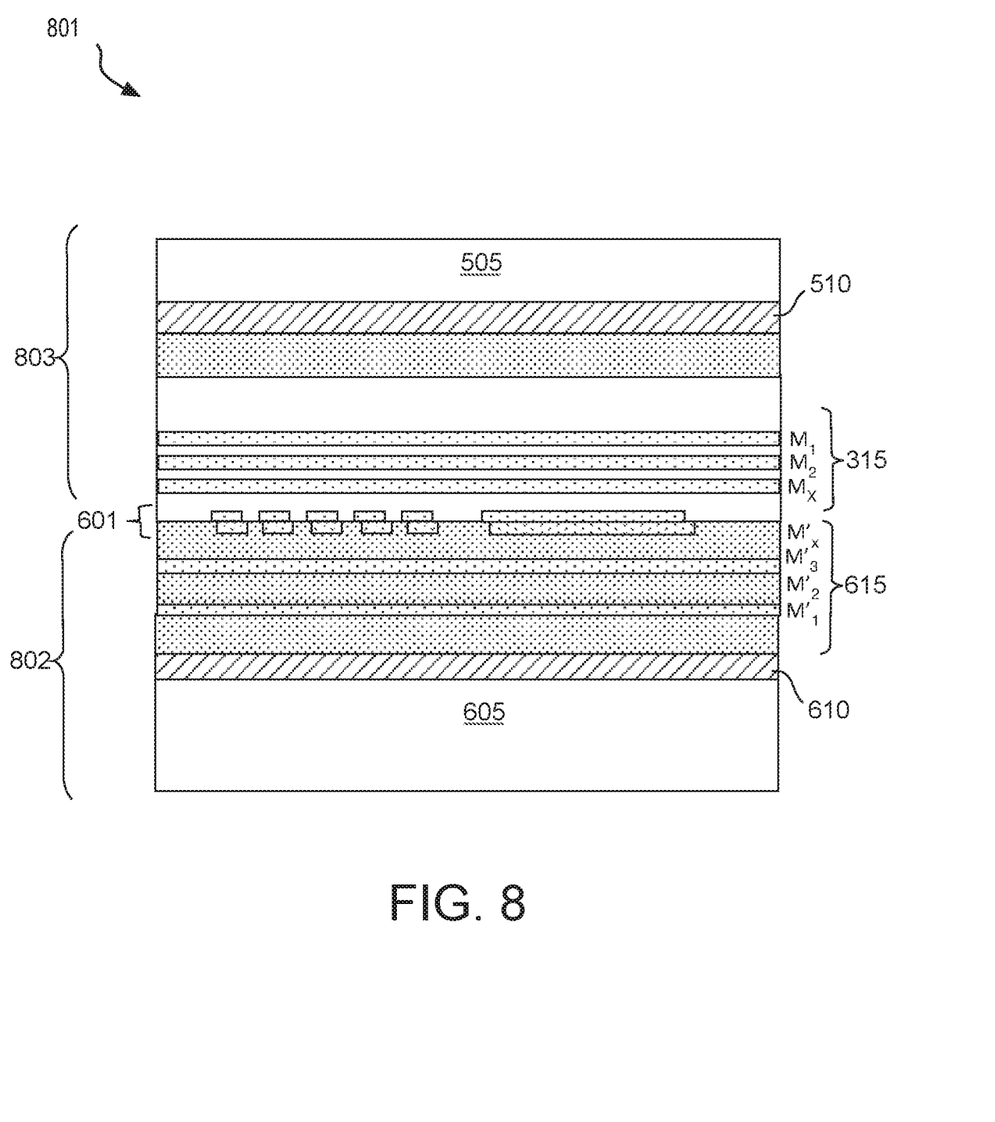
FIG. 8 is a cross-sectional view of a bonded IC structure comprising a composite interconnect structure including a diffusion barrier, in accordance with some embodiments.

Composite interconnect structures, such as those illustrated in FIG. 6B or 7B, may be integrated into any composite IC device. FIG. 8 is a cross-sectional view of a bonded IC structure 801 comprising composite interconnect structure 601 that includes a supplemental diffusion barrier, which may have any of the features described above. In alternative embodiments, bonded IC structure 801 may comprise composite interconnect structure 701, for example having any of the corresponding features described above.

As shown in FIG. 8, a composite IC device 801 includes a first IC chip 802 electrically coupled to a second IC chip 803 through composite interconnect structure 601. In some examples, composite IC device 801 has been singulated from a composite workpiece that included bonding workpieces 500 and 600 (FIG. 5). IC device 801 includes two device layers 510 and 610 between two substrates 505 and 605. BEOL metallization levels 515 interconnect transistors of device layer 510, and BEOL metallization levels 615 interconnect transistors of device layer 510. In passive interposer embodiments, at least one of device layers 510 or 610 is absent with at least one of the bonding workpieces comprising only metallization levels 515 or 615, respectively. Composite interconnect structure 601 includes a predominantly Cu feature from an uppermost one of metallization levels 615 bonded to another predominantly Cu feature from an uppermost one of metallization levels 515. At least where the two Cu features are laterally offset from each other, composite interconnect structure 601 includes a barrier material between the Cu features and adjacent dielectric material, for example substantially as described elsewhere herein. As illustrated, composite IC device 801 may be subsequently processed as any single IC chip might be. For example, a first-level interconnect (FLI) process may be performed and the composite IC device 801 mounted to a host, such as a package substrate.

Figure 9:
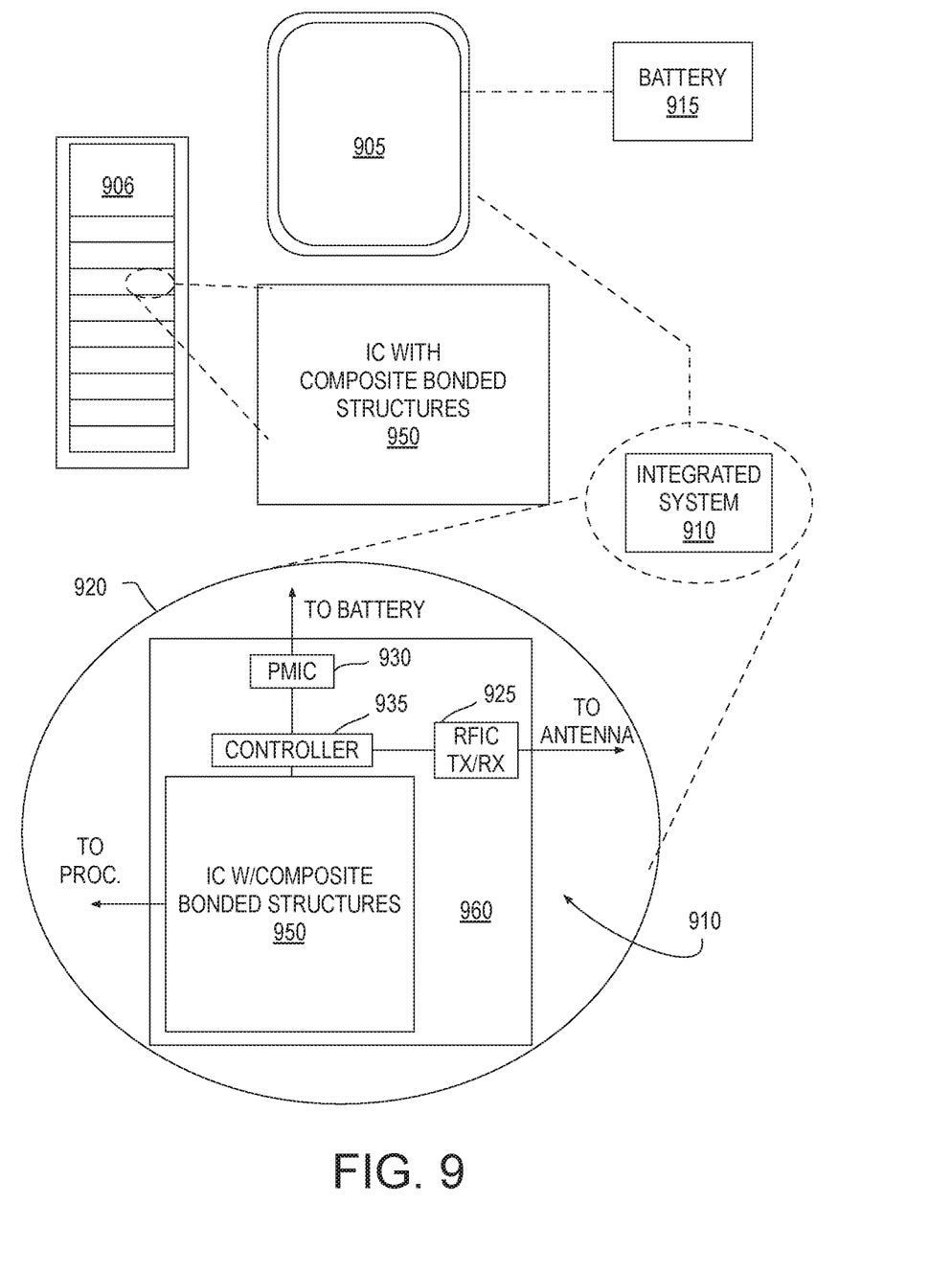
FIG. 9 illustrates a system employing a composite IC structure including a supplemental diffusion barrier, in accordance with some embodiments.

FIG. 9 illustrates a system in which a mobile computing platform 905 and/or a data server machine 906 employs an IC device including at least one hybrid bonded composite structure having a supplemental diffusion barrier, in accordance with some embodiments. The server machine 906 may be any commercial server, for example including any number of high-performance computing platforms disposed within a rack and networked together for electronic data processing, which in the exemplary embodiment includes a packaged composite IC 950. The mobile computing platform 905 may be any portable device configured for each of electronic data display, electronic data processing, wireless electronic data transmission, or the like. For example, the mobile computing platform 905 may be any of a tablet, a smart phone, laptop computer, etc., and may include a display screen (e.g., a capacitive, inductive, resistive, or optical touchscreen), a chip-level or package-level integrated system 910, and a battery 915.

Whether disposed within the integrated system 910 illustrated in the expanded view 920, or as a stand-alone packaged chip within the server machine 906, composite IC 950 may include at least one composite interconnect structure having an augmentation metal or a recessed dielectric, for example as described elsewhere herein. Composite IC 950 may further include silicon CMOS. Composite IC 950 may be further coupled to a host substrate 960, along with, one or more of a power management integrated circuit (PMIC) 930, RF (wireless) integrated circuit (RFIC) 925 including a wideband RF (wireless) transmitter and/or receiver (TX/RX) (e.g., including a digital baseband and an analog front end module further comprises a power amplifier on a transmit path and a low noise amplifier on a receive path), and a controller 935. PMIC 930 may perform battery power regulation, DC-to-DC conversion, etc., and so has an input coupled to battery 915 and with an output providing a current supply to other functional modules. Composite IC 950 may have an output coupled to an antenna (not shown) to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond.

Figure 10:
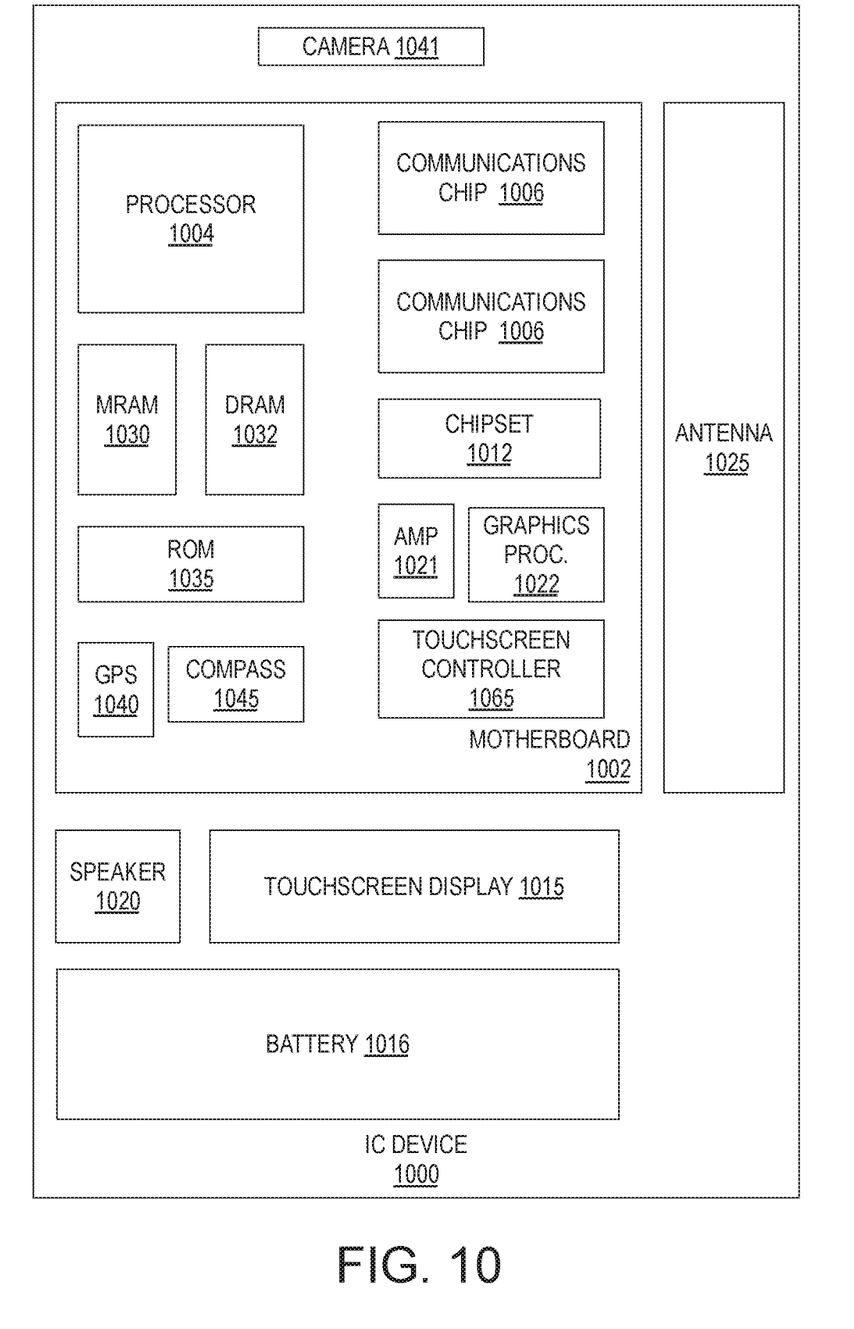
FIG. 10 is a functional block diagram illustrating an electronic computing device, in accordance with some embodiments.

FIG. 10 is a functional block diagram of an electronic computing device 1000, in accordance with some embodiments. Device 1000 further includes a motherboard 1002 hosting a number of components, such as, but not limited to, a processor 1004 (e.g., an applications processor). Processor 1004 may be physically and/or electrically coupled to motherboard 1002. In some examples, processor 1004 includes a bonded composite IC structure, for example as described elsewhere herein. In general, the term "processor" or "microprocessor" may refer to any device or portion of a device that processes electronic data from registers and/or memory to transform that electronic data into other electronic data that may be further stored in registers and/or memory.

In various examples, one or more communication chips 1006 may also be physically and/or electrically coupled to the motherboard 1002. In further implementations, communication chips 1006 may be part of processor 1004. Depending on its applications, computing device 1000 may include other components that may or may not be physically and electrically coupled to motherboard 1002. These other components include, but are not limited to, volatile memory (e.g., DRAM 1032), non-volatile memory (e.g., ROM 1035), flash memory (e.g., NAND or NOR), magnetic memory (MRAM 1030), a graphics processor 1022, a digital signal processor, a crypto processor, a chipset 1012, an antenna 1025, touchscreen display 1015, touchscreen controller 1065, battery 1016, audio codec, video codec, power amplifier 1021, global positioning system (GPS) device 1040, compass 1045, accelerometer, gyroscope, speaker 1020, camera 1041, and mass storage device (such as hard disk drive, solid-state drive (SSD), compact disk (CD), digital versatile disk (DVD), and so forth), or the like. In some exemplary embodiments, at least one of the functional blocks noted above comprise an IC device including a composite hybrid bonded interface, for example as described elsewhere herein.

Communication chips 1006 may enable wireless communications for the transfer of data to and from the computing device 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 1006 may implement any of a number of wireless standards or protocols, including but not limited to those described elsewhere herein. As discussed, computing device 1000 may include a plurality of communication chips 1006. For example, a first communication chip may be dedicated to shorter-range wireless communications, such as Wi-Fi and Bluetooth, and a second communication chip may be dedicated to longer-range wireless communications such as GPS, EDGE, GPRS, CDMA, WiMAX, LTE, Ev-DO, and others.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

It will be recognized that the invention is not limited to the embodiments so described, but can be practiced with modification and alteration without departing from the scope of the appended claims. For example the above embodiments may include specific combinations of features as further provided below.

In first examples, an integrated circuit (IC) device structure comprises first metallization layers interconnected to transistors of a first device layer. The device structure comprises second metallization layers interconnected to transistors of a second device layer. The structure comprises a composite interconnect structure further comprising a first feature of one of the first metallization layers and a second feature of one of the second metallization layers. The second feature is laterally offset from the first feature, and an overlapping first portion of the second feature is in contact with the first feature. The composite interconnect structure further comprises a barrier material between a dielectric material and a non-overlapping second portion of at least the second metal feature. The barrier material comprises a compound of a metal present in at least one of the first and second features.

In second examples, for any of the first examples, the barrier material has a layer thickness of no more than 10 nm, and the compound comprises the metal and at least one of O, S, Se, or Te.

In third examples, for any of the first through second examples the composite interconnect structure further comprises a second barrier material adjacent to a sidewall of at least one of the first or second feature. The metal is a first metal, and the second barrier material comprises a second metal, different than the first metal.

In fourth examples, for any of the third examples the barrier material is also between the second barrier material and the sidewall of each of the first and second features.

In fifth examples, for any of the third through fourth examples the second barrier material is in direct contact with the sidewall of each of the first and second features.

In sixth examples, for any of the third through fifth examples, the first and second features comprise predominantly Cu, the first metal is Cu, Al, Mn, or Zn, and the second metal is Ta.

In seventh examples, for any of the first examples the metal is Cu, the compound comprises at least one of S, Se, or Te.

In eighth examples, for any of the first examples the metal is Cu, the compound comprises O and at least one of Al, Mg, Mn, or Zn.

In ninth examples, for any of the first or second examples the first and second features each have a lateral length of at least 1 µm, the first and second bond interfaces are lateral offset by at least 100 nm, and the barrier material is crystalline.

In tenth examples, an integrated circuit (IC) device structure comprises first metallization layers embedded in one or more first dielectric materials. The structure comprise second metallization layers embedded in one or more second dielectric materials, and the structure comprises a composite interconnect structure. The composite interconnect structure comprises a first feature of one of the first metallization layers, the first feature comprising predominantly Cu. The composite interconnect structure comprises a second feature of one of the second metallization layers. The second feature comprises predominantly Cu. The second feature is laterally offset from the first feature, and an overlapping first portion of the second feature is in contact with the first feature. The composite interconnect structure further comprises a first barrier material in contact with a non-overlapping second portion of the first metal feature and in contact with one of the second dielectric materials. The composite interconnect structure further comprises a second barrier material in contact with a non-overlapping second portion of the second metal feature and in contact with one of the first dielectric materials. The first and second barrier materials comprises a compound of either Cu or of a dopant metal present in the first and second features.

In eleventh examples, for any of the tenth examples the first and second barrier materials have a layer thickness of no more than 10 nm, and the metallic compound is crystalline, and comprises Cu and at least one of S, Se, or Te.

In twelfth examples, for any of the tenth or eleventh examples the first barrier material is also between at least one of the first dielectric materials and the sidewall of the first feature, and wherein the second barrier material is also between at least one of the second dielectric materials and the sidewall of the second feature.

In thirteenth examples, for any of the tenth or eleventh examples the first and second barrier materials have a layer thickness of no more than 10 nm, and the metallic compound is amorphous and comprises O and at least one of Al, Mn, Mg, or Zn.

In fourteenth examples, for any of the thirteenth examples, the barrier material further comprises Si.

In fifteenth examples, a method of fabricating an integrated circuit (IC) structure, the method comprises forming a first hybrid bonding interface comprising a first metallization feature and a first dielectric material. The first metallization feature comprises Cu. The method comprises forming a second hybrid bonding interface comprising a second metallization feature and a second dielectric material. The second metallization feature comprising Cu. The method comprises forming a composite interconnect structure comprising the first and second metallization features by bonding the first hybrid bonding interface to the second hybrid bonding interface. The first and second features are laterally offset from each other. The method comprise driving a dopant of the composite interconnect structure to a first interface between a portion of the first metallization feature overlapping the second dielectric material, and to a second interface between a portion of the second metallization feature overlapping the first dielectric material. The method comprises forming a barrier material comprising the dopant at the first and second interface.

In sixteenth examples, for any of the fifteenth examples, the dopant comprises a metal or a chalcogenide.

In seventeenth examples, for any of the fifteenth through sixteenth examples the dopant comprises at least one of S, Se, Te, and the barrier material comprises a Cu chalcogenide.

In eighteenth examples, for any of the fifteenth through sixteenth examples the dopant comprises at least one of Al, Mn, Mg, or Zn, and the barrier material comprises O.

In nineteenth examples, for any of the eighteenth examples the barrier material further comprises Si.

In twentieth examples, for any of the fifteenth examples driving the dopant and forming the barrier material further comprises a thermal anneal at less than 350° C.

However, the above embodiments are not limited in this regard and, in various implementations, the above embodiments may include the undertaking of only a subset of such features, undertaking a different order of such features, undertaking a different combination of such features, and/or undertaking additional features than those features explicitly listed. The scope of the invention should, therefore, be determined with reference to the appended claims, along with the full scope of equivalents to which such claims are entitled.

What is claimed is:

1. An integrated circuit (IC) device structure, comprising:
   first metallization layers interconnected to transistors of a first device layer;
   second metallization layers interconnected to transistors of a second device layer; and
   a composite interconnect structure comprising:
     a first feature of one of the first metallization layers;
     a second feature of one of the second metallization layers, wherein the second feature is laterally offset from the first feature, and an overlapping first portion of the second feature is in contact with the first feature, wherein a sidewall of each of the first and second features is in contact with a dielectric material, and wherein the dielectric material in contact with the sidewall of the first feature is in direct contact with the dielectric material in contact with the sidewall of the second feature; and
     a barrier material between the dielectric material in contact with the sidewall of the first feature and a non-overlapping second portion of the second feature, wherein the barrier material comprises a compound of a metal present in at least one of the first and second features.

2. The IC device structure of claim 1, wherein:
   the barrier material has a layer thickness of no more than 10 nm; and
   the compound comprises the metal and at least one of O, S, Se, or Te.

3. The IC device structure of claim 1, wherein:
   the first and second features further comprise a second barrier material in contact with the dielectric material;
   the metal is a first metal; and
   the second barrier material comprises a second metal, different than the first metal.

4. The IC device structure of claim 3, wherein the second barrier material of the first feature is laterally offset from the second barrier material of the second feature and wherein the barrier material spans the offset between the second barrier materials of the first and second features.

5. The IC device structure of claim 3, wherein the second barrier material of the first feature is in direct contact with a first dielectric material on a first side of a bond plane passing through the composite interconnect structure, and the second barrier material of the second feature is in direct contact with a second dielectric material on a second side of the bond plane.

6. The IC device structure of claim 3, wherein:
the first and second features comprise predominantly Cu;
the first metal is Cu, Al, Mn, or Zn; and
the second metal is Ta.

7. The IC device structure of claim 2, wherein the metal is Cu, the compound comprises at least one of S, Se, or Te.

8. The IC device structure of claim 1, wherein the metal is Cu, the compound comprises O and at least one of Al, Mg, Mn, or Zn.

9. The IC device structure of claim 1, wherein:
the first and second features each have a lateral length of at least 1 µm;
the first and second features are laterally offset by at least 100 nm;
and the barrier material is crystalline.

10. The IC device structure of claim 1, wherein the dielectric material in contact with the sidewall of the first feature is substantially planar with a bonding surface of the first feature.

11. The IC device structure of claim 10, wherein the dielectric material in contact with the sidewall of the second feature is substantially planar with a bonding surface of the second feature.

12. The IC device structure of claim 1, wherein the barrier material has a thickness of no more than 10 nm.

13. An integrated circuit (IC) device structure, comprising:
first metallization layers embedded in one or more first dielectric materials;
second metallization layers embedded in one or more second dielectric materials; and
a composite interconnect structure comprising:
a first feature of one of the first metallization layers, wherein:
the first feature comprises predominantly Cu; and
a second feature of one of the second metallization layers, wherein:
the second feature comprises predominantly Cu;
the second feature is laterally offset from the first feature; and
an overlapping first portion of the second feature is in contact with the first feature;
a first barrier material in contact with a non-overlapping second portion of the first feature and in contact with one of the second dielectric materials, and
a second barrier material in contact with a non-overlapping second portion of the second feature and in contact with one of the first dielectric materials, wherein the first and second barrier materials comprise a compound of either Cu or of a dopant metal present in the first and second features.

14. The IC device structure of claim 13, wherein:
the first and second barrier materials have a layer thickness of no more than 10 nm; and
the metallic compound is crystalline, and comprises Cu and at least one of S, Se, or Te.

15. The IC device structure of claim 14, wherein the first barrier material is also between at least one of the first dielectric materials and the sidewall of the first feature, and wherein the second barrier material is also between at least one of the second dielectric materials and the sidewall of the second feature.

16. The IC device structure of claim 14, wherein:
the first and second barrier materials have a layer thickness of no more than 10 nm; and
the compound is amorphous and comprises 0 and at least one of Al, Mn, Mg, or Zn.

17. The IC device structure of claim 16, wherein the barrier material further comprises Si.

18. The IC device structure of claim 13, wherein the first and second barrier materials have a thickness of no more than 10 nm.

19. The IC device structure of claim 13, wherein one of the first dielectric materials is in direct contact with one of the second dielectric materials.

20. The IC device structure of claim 13, wherein the first and second barrier materials are substantially planar with a bonding surface of the IC device structure.

* * * * *